United States Patent [19]
Patel et al.

[11] Patent Number: 5,946,190
[45] Date of Patent: Aug. 31, 1999

[54] DUCTED HIGH ASPECT RATIO HEATSINK ASSEMBLY

[75] Inventors: Chandrakant D. Patel, Fremont; Frederic Amerson, Los Altos, both of Calif.; Christian Belady, McKinley, Tex.

[73] Assignee: Hewlett-Packard Company, Palo Alto, Calif.

[21] Appl. No.: 08/920,515

[22] Filed: Aug. 29, 1997

[51] Int. Cl.⁶ .................................................. H05K 7/20
[52] U.S. Cl. ............... 361/700; 165/104.21; 165/104.33; 174/15.2; 257/715; 257/722
[58] Field of Search ..................... 165/104.21, 104.33, 165/80.4; 174/15.2; 257/714–716, 722; 361/689, 692, 699–702

[56] References Cited

U.S. PATENT DOCUMENTS

| | | | |
|---|---|---|---|
| 4,120,019 | 10/1978 | Arii et al. ................................ | 174/15.2 |
| 4,414,604 | 11/1983 | Matsui et al. ............................ | 174/15.2 |
| 5,396,403 | 3/1995 | Patel . | |
| 5,402,160 | 3/1995 | Kadowaki et al. ...................... | 174/15.2 |
| 5,430,611 | 7/1995 | Patel . | |
| 5,587,882 | 12/1996 | Patel . | |
| 5,598,320 | 1/1997 | Toedtman et al. ....................... | 361/700 |

OTHER PUBLICATIONS

"Forced Air Cooling for High Power Pin Grid Array Packages in Confined Spacings," by S. L. Chao and E.D. Humm; published in Cooling Technology for Electronic Equipment, 1988, pp. 157–167; by Hemisphere Publishing Corporation. Product Data Sheet by Showa Aluminum Corporation: Aluminum Heat Exchangers, Nov. 1988, printed in Japan.

*Primary Examiner*—Gregory Thompson

[57] ABSTRACT

A low-cost high aspect ratio skived heatsink with high performance ducting in order to optimize airflow over and through the skived fins. The skived heatsink can additionally have formed channels or extruded holes for insertion of a heatsink pipe therein. A thermally enhanced compound is used between the heatsink and heatpipe to provide a low thermal resistance between the parts. The heatpipe is expanded to optimally fill the channel or hole by injecting pressured fluid into the pipe before sealing the pipe with working fluid, or via heating of a sealed pipe and expansion of the working fluid therein. A partitioned cooling system can additionally be used, one partitioned section having high volume airflow with low static pressure, and another partitioned section using higher velocity ducted air over a plurality of skived heatsinks.

6 Claims, 11 Drawing Sheets

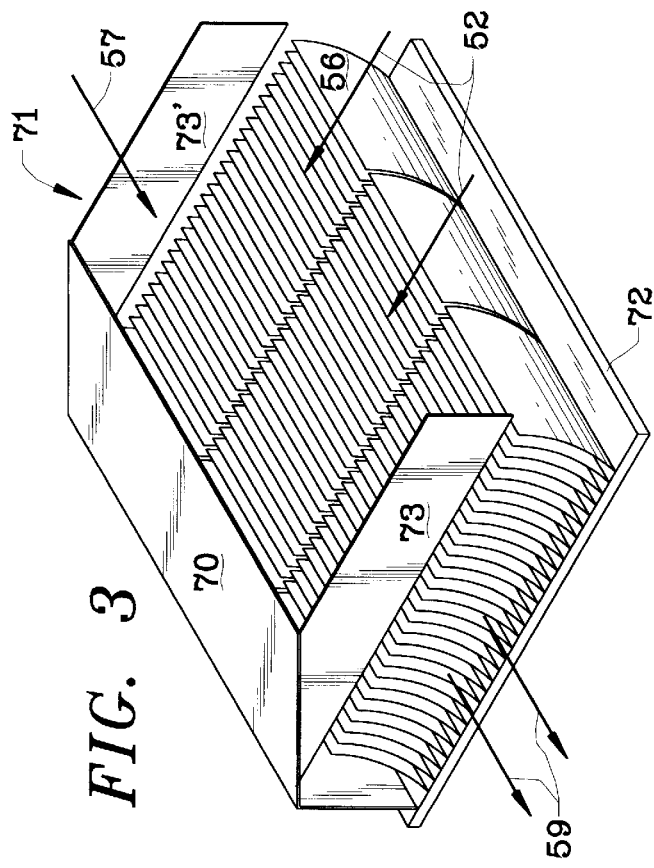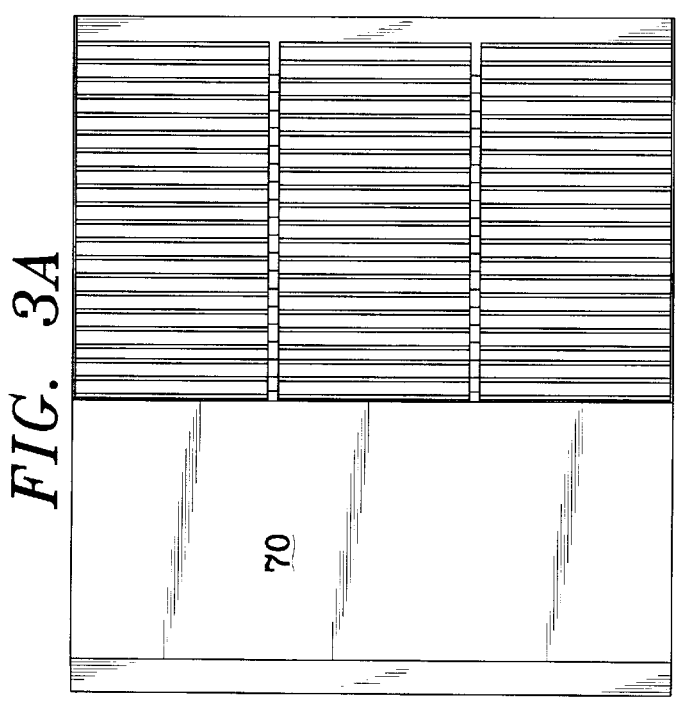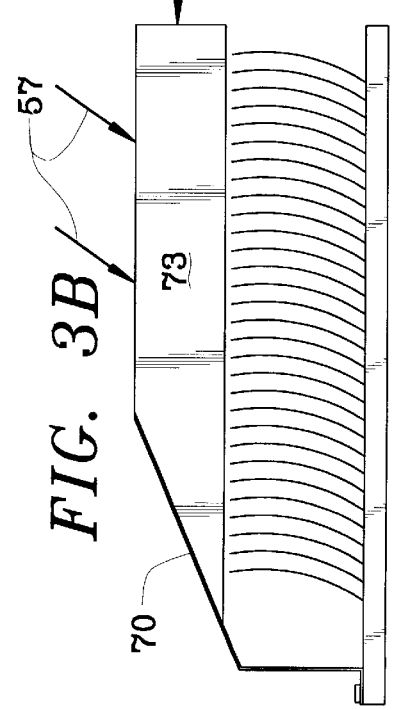

DUCTED HIGH ASPECT RATIO HEATSINK ASSEMBLY

FIELD OF INVENTION

This invention relates to a high aspect ratio heatsink assembly with expanded heatpipes for use with electronic components which is efficient and inexpensive to manufacture. The invention also discloses various applications of the heatsink assembly in cooling high power processor and memory modules.

BACKGROUND OF THE INVENTION

Modern electronic appliances such as computers have many hundreds of integrated circuits and other printed circuit boards. Many of these components generate heat during normal operation. Components that are relatively large, or that have a relatively small number of functions in relation to their size, as for example individual transistors or small scale integrated circuits, usually dissipate all their heat without a heat sink. The large physical size of such components, especially as compared with their active portions, limits their density on a circuit board sufficiently so that there is enough room for any heatsinks that might be needed. Accordingly, any component that needs assistance in dissipating heat can have a heatsink of its own.

The term "heatsink" as used herein generally refers to a passive device, for example an extruded aluminum plate with a plurality of fins, the heatsink being thermally coupled to an electronic component to absorb and dissipate heat into the air by convection.

As the state of the electronic arts has advanced, components have become smaller and smaller, to the extent that many thousands of them are now combined into a single integrated circuit chip. In addition, components are being made to operate faster and faster to provide the computing power that is increasingly being required of computers and other electronic devices. As the operating speed increases, so does the amount of heat which the components must dissipate. These factors have made it more difficult for many components to dissipate the heat they generate without the assistance of external heat sinks. At the same time, increasing component density has made it impractical to provide individual heat sinks for the increasing numbers of components that need them. Accordingly, it has become necessary for many components to share one heat sink.

One widely-used method of increasing the speed of an electronic circuit is to reduce the lengths of connecting wires. In part, this is being done by abandoning the older practice of enclosing each integrated circuit chip in a separate package in favor of mounting many chips next to each other on a single substrate. Such an assembly of chips and substrate is commonly referred to as a multi-chip module ("MCM"). The chips on an MCM are too small, and usually must be located too near one another on the MCM, to permit the use of separate heat sinks for the individual chips. Accordingly, in order to dissipate the heat generated by the chips on an MCM, it is often necessary to use a single heatsink for a large group of chips or components.

Accordingly, a heatsink should be capable of high convection of heat into the surrounding air. Heatsinks for electronic components have achieved this ability in the past by having a multitude of fins physically connected to a heatsink base which is then thermally coupled to a substrate having heat generating components. The manufacturing process for heatsinks is difficult and expensive as the individual fins must be connected to a base with a matching coefficient of heat transfer or conductivity. Without a proper thermal conductivity match, the heat is not effectively conveyed to the fins and dissipated into the air from the heatsink base.

To avoid thermal mismatches, a heatsink and the related fins might be extruded as one single piece, thereby eliminating any attachment process of the fins. Such extrusions, however, provide lower aspect ratios, e.g. 4–5, and hence lower surface area across the array of fins. The aspect ratio is defined as the height of the fin divided by the gap between each subsequent fin, or height/gap. Due to the low surface area, the extruded heatsinks require higher air velocities than that required for high density, high aspect ratio heatsinks. Relatedly, extruded heatsinks require higher tangential velocities of air, e.g. 4 to 5 meters/second (m/s), flowing over the fins in order to remove sufficient heat. To provide higher air velocities, larger more cumbersome fans, or fans that require more power to operate, are generally needed. Other formation methods that can produce higher aspect ratios are, but generally prove to be even more expensive. Such methods include, for instance, machining fins via a saw cut, or brazing fins onto the part.

Yet another expensive and time consuming process for achieving a thermal match involves physically bonding the fins to a base structure. Ideally, a heatsink will employ as many fins as possible to maximize the surface area exposed to the surrounding air. However, the time and expense involved in bonding the individual fins leads to a trade-off between the aspect ratio and the cost of constructing the overall heatsink. Heatpipes can also be incorporated into heatsinks to convey heat from an electronic component to the fins for dissipation of the heat into the air. Incorporation of such heatpipes, however, can require exacting manufacturing tolerances in order to provide a low thermal resistance between the heatpipe and the heatsink material.

As a result, a low-cost, high aspect ratio heatsink assembly is needed for application to heat producing electronic components. Heatpipes should be incorporated at minimum cost, but with maximum thermal efficiency between the assembly parts. The heatsink assembly should provide a effective heatsink and means of application so that sufficient "wetting" of the fin surfaces is achieved, with relatively low airflow being required over the fins.

SUMMARY OF THE INVENTION

The present invention provides a heatsink assembly with a high aspect ratio, yet relatively low cost, that adequately dissipates heat generated by a connected electronic device. The heatsink can be batch produced via the skiving process described, with heatpipes installed via the expansion process described. Accordingly, a low cost heatsink assembly with a high aspect ratio and low thermal resistance is provided.

One solution in constructing heatsinks for electronic applications is to use a process which "skives" the fins from extruded sheets of metal, such as aluminum, with a high production throughput. The resulting process creates an unusual fin shape which is an artifact of the controlled "skiving" process, wherein the action is much like planing wood. A sharpened tool is brought into angular contact with the surface of the aluminum sheet to repeatedly form fins which are spaced very close together. Aspect ratios (e.g. height/gap) of greater than 8, and nominally 10, are generally necessary to adequately dissipate heat. The skived heatsink manufacturing process can easily produce such aspect ratios. More importantly, each fin identically matches the thermal coefficient of the underlying base surface because the fin is a carved part of the base surface. Skived heatsinks are much lower in cost than conventional high aspect ratio heatsinks which require individual fins to be bonded in a thermally conductive way to the base. As a result, bonded heatsinks often cost four to five times as much, and manufacturing facilities have much lower throughputs. Additionally, the skiving process is capable of producing a relatively lower mass heatsink which is an important consideration in many electronic applications. While such manufacturing technology has been used for items in the automotive industry, it is unknown in the computer industry according to the present invention. A known manufacturer of skived heatsinks is Showa Aluminum of Japan.

A skive heatsink can readily be used to dissipate sufficient heat from electronic applications with relatively lower airflows, e.g. 1.5 to 2 m/s. The high aspect ratio of the heatsink can meet a target thermal resistance, e.g. 0.25 to 0.40° C./W (degrees Celsius per Watt), if the large surface area is utilized properly. However, air flow management is critical to each particular application.

The low-cost, yet efficient incorporation of heatpipes into a high aspect ratio skived heatsink is also addressed by the present invention. One prior solution to providing low thermal resistance is to fill holes in the heatsink base directly with a working thermal fluid, and thereafter sealing off the holes. However, aluminum, which is typically used to form a skived heatsink, cannot effectively accommodate water and would alternatively require a non-environmentally friendly fluid, such as a refrigerant. In contrast, heatpipes which are constructed of copper tubing and water can be conveniently used therein. Known manufacturers of such heatpipes include Fujikura of Japan and Thermacore of the United States.

Accordingly, the present invention provides for the insertion of inexpensive, off-the-shelf heatpipes into holes or channels formed in the heatpipe base. The present invention also provides for expansion of the heatpipes thereafter by using pressurized fluid, or via heating of the heatpipe to cause expansion with the additional use of thermal enhanced compounds, e.g. lubricants, sealants, greases, waxes, or the like between the heatpipe and the heatsink materials, the expanded heatpipe is thermally connected to the heatsink with a low thermal resistance, but without the need for specially machined parts. The compounds thereby fill-in any imperfections in the adjoining surfaces and eliminate any air pockets.

While such skived heatsink assemblies are inexpensive, efficient, and have a large surface area (and hence a high aspect ratio), the proper application in the computer industry requires significant attention in the area of air handling. The present invention thereby discloses examples of ducting between the formed heatsink fins that enhances performance and makes the disclosed heatsink usable in high power electronics and computer applications. Additionally disclosed are various assemblies that can be used to cool high power processor and memory modules. Hence, if applied properly, the large surface produced by the skiving process, along with the lost cost addition of heatpipes into the heatsink assembly, provides for low-cost, forced air cooling of high power modules in computer systems.

Other advantages of this invention will become apparent from the following description taken in conjunction with the accompanying drawings wherein are set forth, by way of illustration and example, certain embodiments of this invention. The drawings constitute a part of this specification and include exemplary embodiments of the present invention and illustrate various objects and features thereof.

BRIEF DESCRIPTION OF THE DRAWINGS

FIG. 3 shows a perspective view of yet another ducting configuration.

FIG. 3A shows a top view of the ducting configuration of FIG. 3A.

FIG. 3B shows a side view of the ducting configuration of FIG. 3A.

FIG. 3C shows a side view of the ducting configuration of FIG. 3A.

DETAILED DESCRIPTION OF THE PREFERRED EMBODIMENT

Although the invention has been described in terms of a specific embodiments, it will be readily apparent to those skilled in this art that various modifications, rearrangements and substitutions can be made without departing from the spirit of the invention. The scope of the invention is defined by the claims appended hereto.

Figure 1:
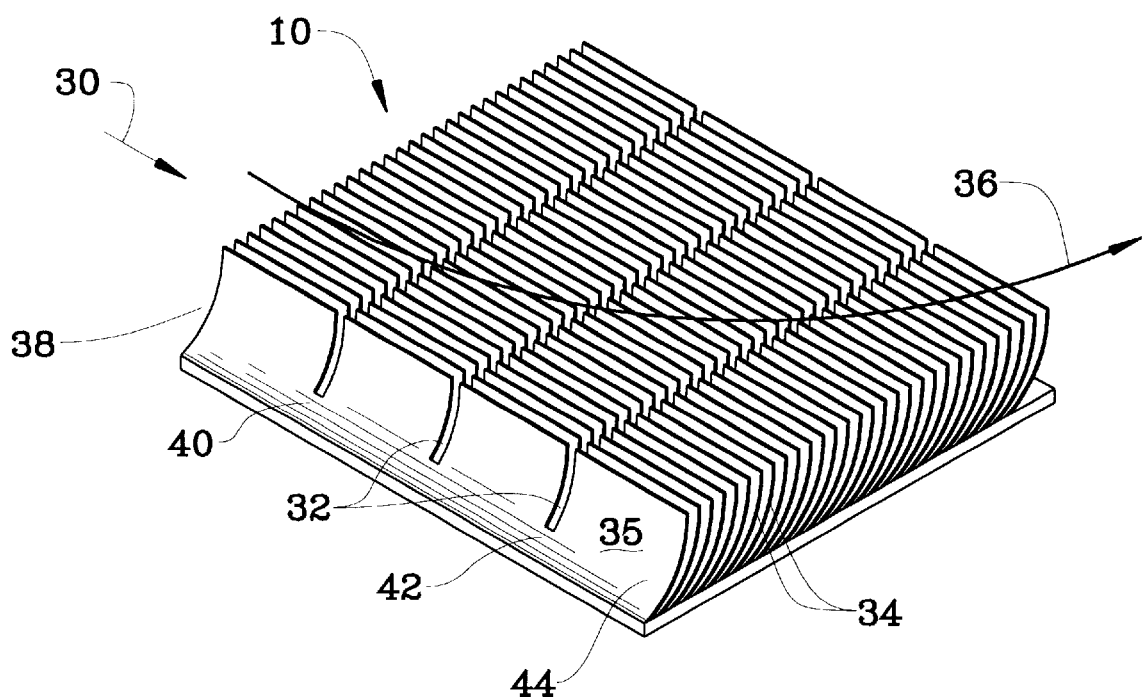
FIG. 1 (prior art) shows a perspective view of a skived heatsink with an example incident airflow indicated over the fins.
Figure 1A:
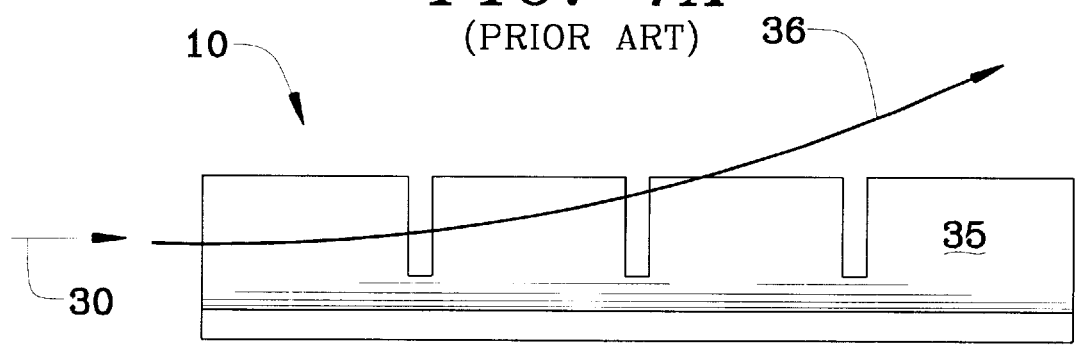
FIG. 1A (prior art) shows a side view of the skived heatsink of FIG. 1 (prior art).

Referring now to FIG. 1 prior art, it is shown that with prior known skived heatsinks, the air tends to bypass the heatsink fin structure 10 in an undirected flow. The incident air 30 with, for example, a free stream velocity of 1.5 m/s, escapes out of the heatsink channels 32 and the spaces 34 in-between the fins 35 as shown by arrow 36. The airflow measured at various points includes the following: 38=1.5 m/s, 40=0.75 m/s, 42=0.25 m/s, and 44=0.1 m/s. FIG. 1A additionally shows a side view of the heatsink fin structure 10. The incident air 30 is shown entering from the side and escaping out from the top of the fins 35, as shown by arrow 36. Accordingly, it has been found that in order to avail optimum performance from the high surface area heatsink, directing or ducting of the system air is necessary.

Figure 2:
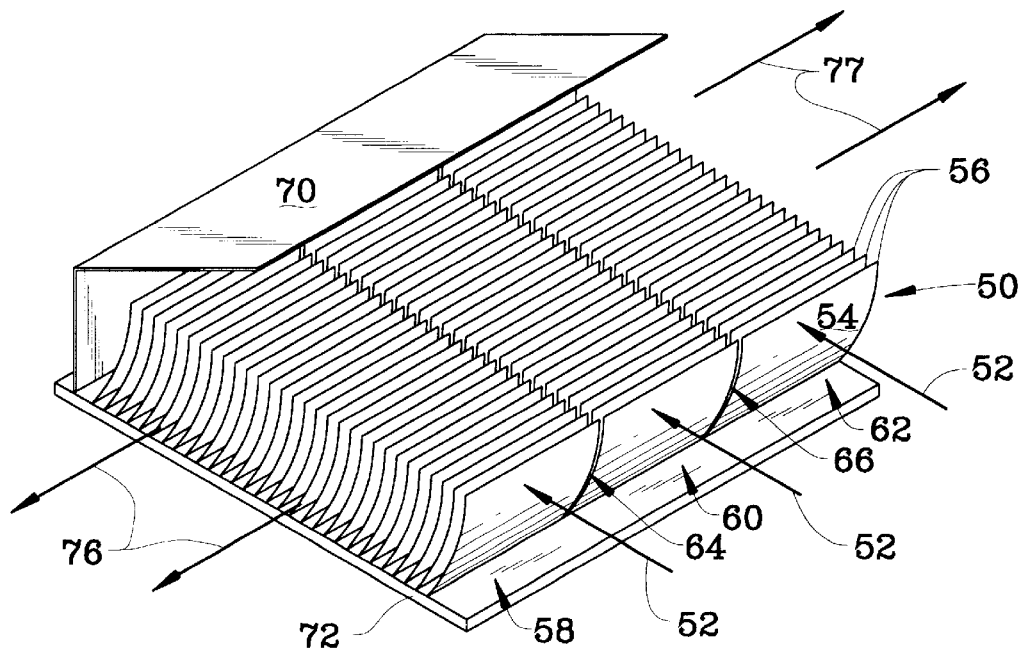
FIG. 2 shows a perspective view of a ducted configuration of a skived heatsink with the fins orthogonal to the incident airflow.
Figure 2A:
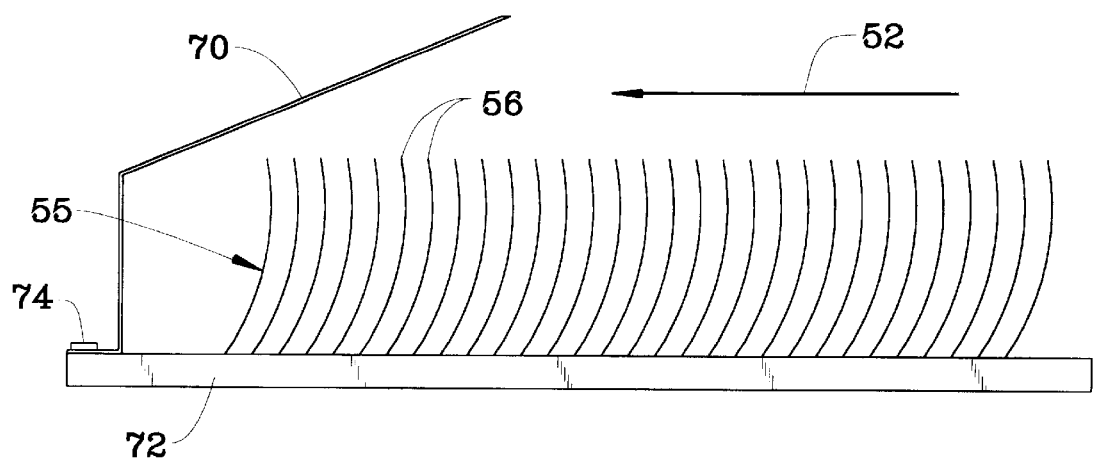
FIG. 2A shows a side view of the ducted configuration of FIG. 2.

Referring now to FIGS. 2 and 2A, an embodiment is shown which includes a skived heatsink 50 with a ducted configuration for directing the airflow. In this instance, the incident airflow 52 is orthogonal to the broad, convexly curved surface 54 of the fins 56. The collection of fins are also formed as three rows of fins 58, 60, and 62, with channels 64, 66 used to aid in their formation. A duct 70 has been attached to the base 72 with an attachment device 74, such as a screw. Duct 70 deflects the incident air 52 downward into and in between the individual fins 56 and incident upon the concave surfaces. The arrows 76 and 77 show the resulting air flowing out from the sides of the skived heatsink 50 from in between the fins 56.

FIG. 3 shows a perspective view of an improved ducting embodiment 71 which is similar to the ducting configuration of FIGS. 2 and 2A. FIGS. 3A, 3B, and 3C show top, side, and front views respectively. This embodiment includes side panels 73, 73' in addition to the angled ducting surface 70. Side panels 73, 73' further serve to channel the incident air 52 which flows orthogonal to the fins 56. The side panels also serve to channel incident air 57 which be directed in certain applications in a more downward fashion onto the fins 56. The air circulates through the fins 56 and exits out the sides as shown by arrows 59. In each case, duct 70 might be formed with various lengths depending upon the amount of deflection required across the full set of fins 56, with maximum wetting desired.

Figure 4:
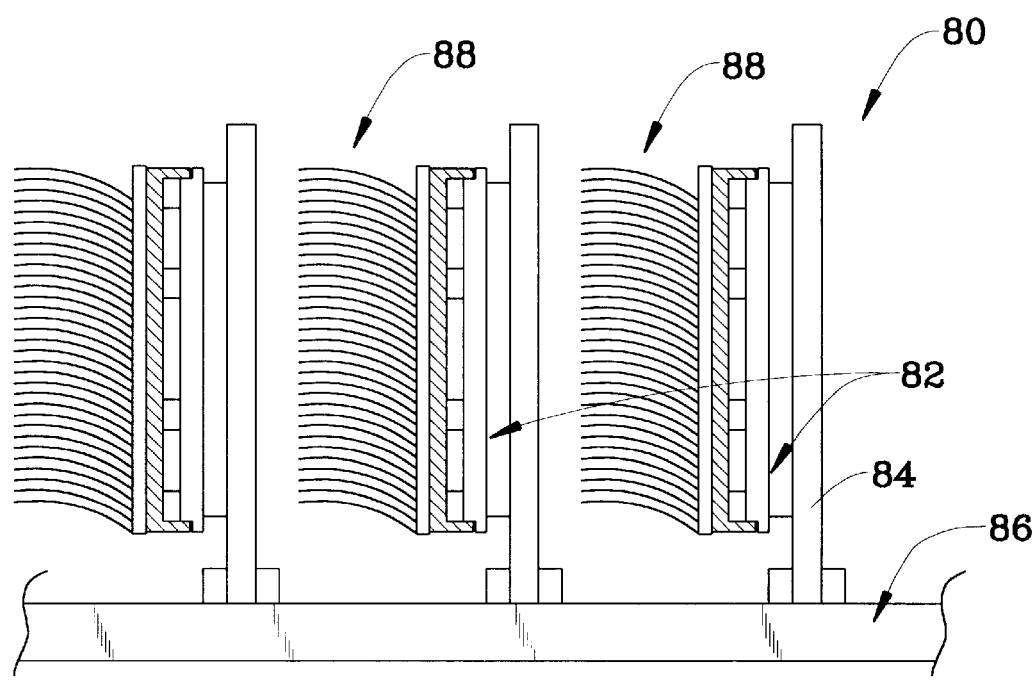
FIG. 4 shows a side view of a skived heatsinks applied to edge mounted processor modules in a card cage configuration.

FIG. 4 shows a side view of a card cage configuration 80 with a multiple number of edge mounted processor modules 82 which are connected to the motherboard 86 via cards 84. A series of skived heatsinks 88 are shown thermally connected to the processor modules 82. This mounting arrangement allows optimum dispensation of heat from the modules 82 as air is blown over the high aspect ratio skived heatsinks 88, which might additionally incorporate heatpipes as described below.

Figure 5:
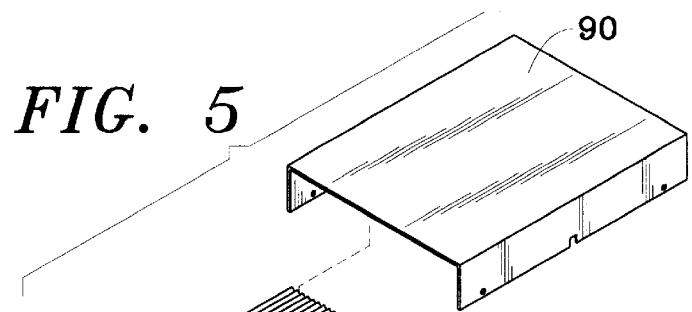
FIG. 5 shows a perspective view of a skived heatsink with a shroud assembly.
Figure 6:
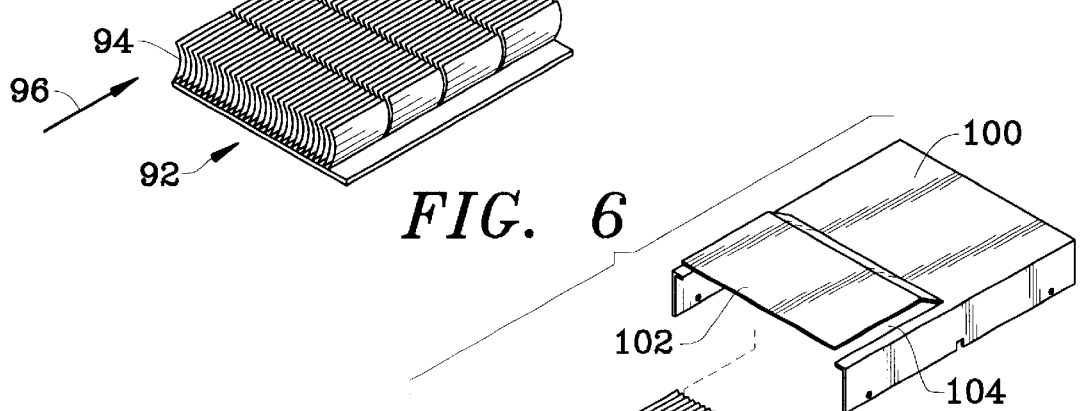
FIG. 6 shows a perspective view of a skived heatsink with a scooped shroud assembly.

FIGS. 5 and 6 show the mechanical implementation of two types of shrouds which are placed over a skived heatsink arrangement to control the flow of incident air. The shrouds might be formed from a variety of materials, including for instance aluminum sheet stock. FIG. 5 shows a straight shroud which is mounted a fixed distance above the fins 94 of the heatsink 92, with an opening perpendicular to the incident air shown by arrow 96. FIG. 6 shows a shroud 100 which includes a scooped surface 102 facing the incident air 96. The openings 104 on each side are generally taped closed or covered. For example purposes only in comparing the configurations, the straight shroud 90 is mounted at a height of 4 mm (millimeters) above the fins 94. The maximum scoop height is 13 mm above the fins 94 at the leading edge, and 4 mm above the fins at the trailing edge. Using a wind tunnel setup producing an incident airflow of 1.75 to 1.8 m/s and specially placed measurement probes on the skived heatsink 94, the average exit velocity (AEV) of the air, as well as the heatsink thermal resistance $R_{hs}$ (in °C./W), were measured as follows. In this instance, the heatsink measured 120 by 120 mm at the base, 27 mm in height, and had 51 fins. For an unducted, or unshrouded configuration: $R_{hs}$=0.69° C./W and AEV=0.4 m/s. For the straight shroud 90: $R_{hs}$=0.52° C./W and AEV=0.52 m/s. For the scooped shroud 100: $R_{hs}$=0.43° C./W and AEV=1.1 m/s. These results demonstrate the overall effectiveness of the skived heatsink, as well as the improved performance of the shrouded configurations.

Figure 7:
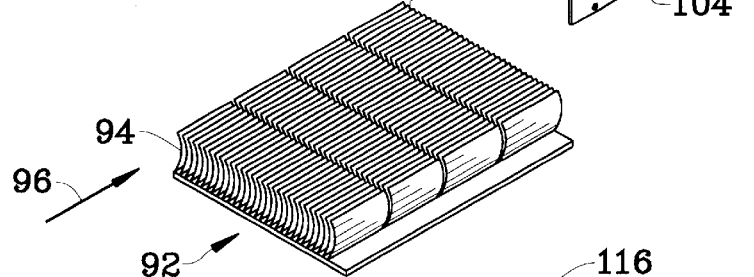
FIG. 7 shows a perspective view of a double-sided skived heatsink.
Figure 8:
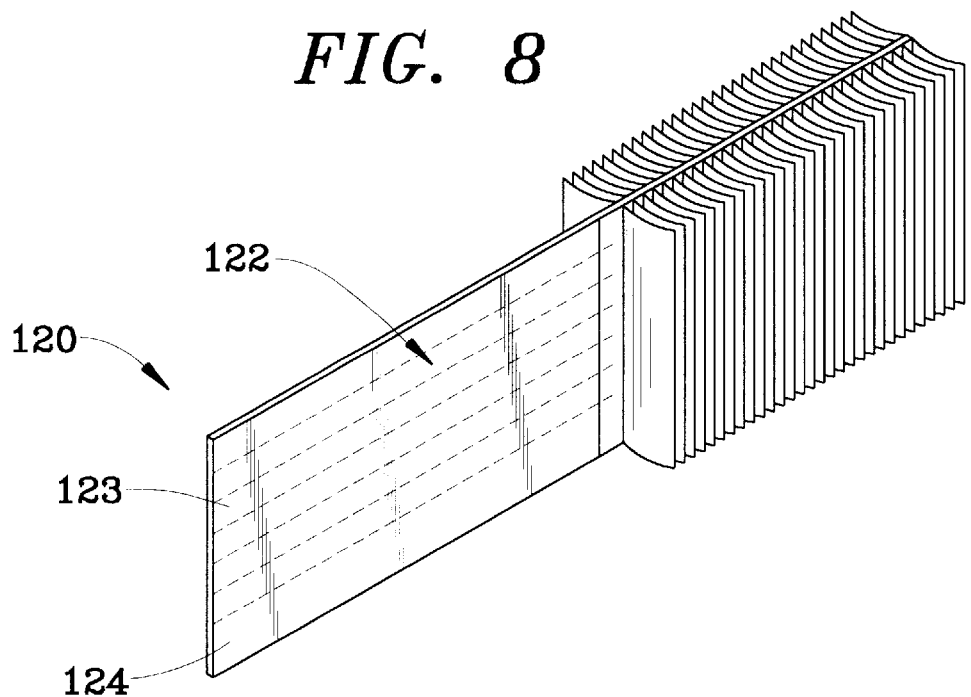
FIG. 8 shows a perspective view of a double-sided skived heatsink with embedded heatpipes shown in phantom.
Figure 8A:
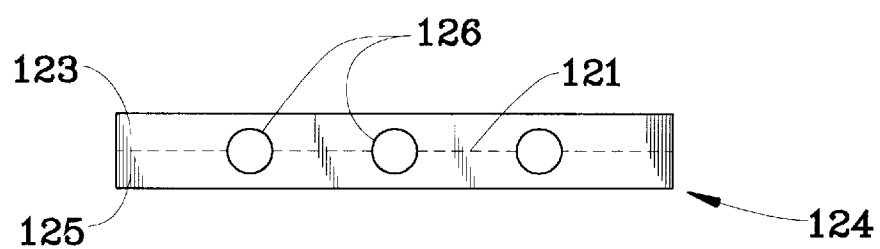
FIG. 8A shows an end view of a heatsink base with circular heatpipe holes.
Figure 8B:
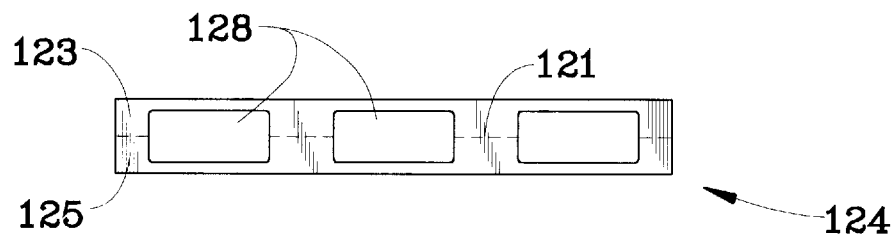
FIG. 8B shows an end view of a heatsink base with rectangular heatpipe holes.

Referring now to FIG. 7, a double sided skived heatsink 110 is shown with central heatpipe section 112. In this instance the heatpipe section is flat with fins skived on either side. FIG. 8 shows the structure of the double sided skived heatsink with phantom lines 122 showing the location of heatpipes 123 embedded through the length of the flat section 124. FIG. 8A shows an end view of section 124 with round holes 126 to accommodate the heatpipes. FIG. 8B shows an end view of section 124 with flat or rectangularly shaped holes 128. As shown with phantom line 121, section 124 might be formed from an upper and lower half 123 and 125 which are joined together to clamp or sandwich heatpipes therebetween in formed channels. To enhance performance, the interface between the heatpipe and skived heatsink is a high performance thermal compound 126C. While heatpipes have been clamped between extruded heatsinks, their incorporation with a high aspect ratio skived heatsink provides even more heat dissipation.

Figure 8C:
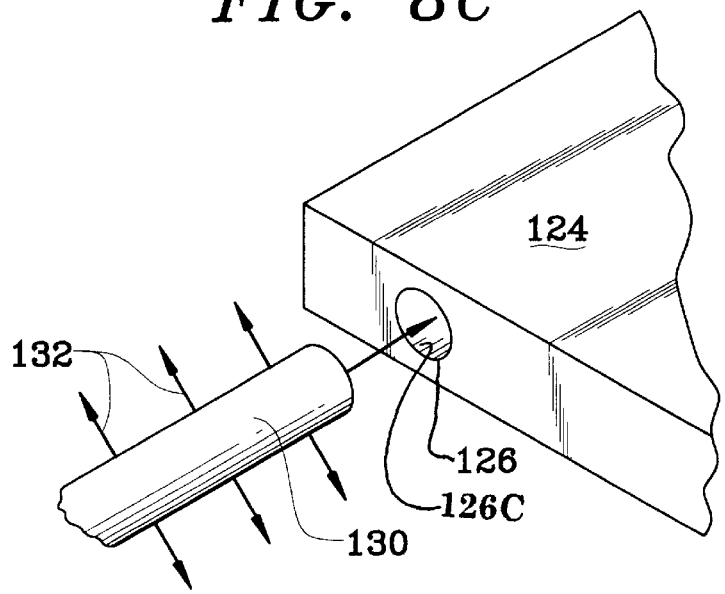
FIG. 8C shows a perspective view of a portion of heatsink base with a heatpipe inserted and expanded into an extruded hole.

Section 124 can also be formed from a single piece of material with holes or channels formed or extruded through the length. Referring now to FIG. 8C, the latter arrangement would involve inserting heatpipes into the various holes 126 formed in section 124. Pressure, as indicated by arrows 132, might then be used to physically expand the heatpipes into the holes. Such pressure might come from external fluid, which is applied before filling the heatpipes with working fluid and sealing them off. Alternatively, the formed heatpipe could be heated and the internal pressure caused by the working fluid would cause the heatpipe to expand into the hole. In order to compensate for manufacturing imperfections in the adjoining surfaces of the heatsink and heatpipe, a high performance thermal compound is used between the heatpipe and the heatsink. This construction could therefore use off-the-shelf heatpipes which would be cheaper to manufacture and would provide an easier mounting technique than custom machined parts.

Generally, this type of formation provides a superior heatsink with a lower interface thermal resistance between the heatpipes and the skived heatsink. While shown circular and rectangular in the examples, the lengthwise holes or channels for accommodating the heatpipes in section 124 might be any shape. Similarly, while shown as rectangular and flat, section 124 might be any shape within the intended scope of the present invention.

Figure 9:
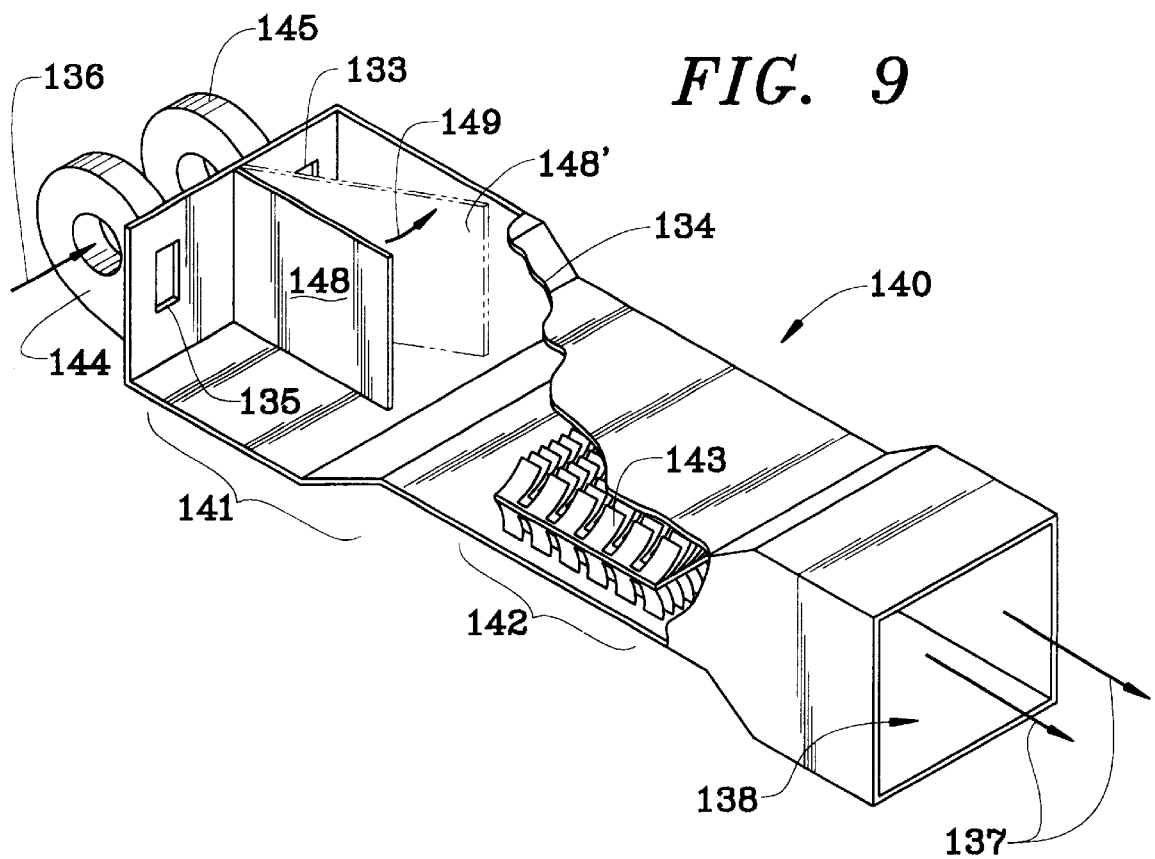
FIG. 9 shows a side view of a ducted air flow configuration with impedance matched blowers for containing and cooling the skived heatsink.

Referring now to FIG. 9, an example of a ducted assembly 140 is shown utilizing redundant impedance matched blowers. The cutaway 134 of section 142 shows the area for containing a skived heatsink 143, preferably a double-sided skived heatsink formation. The walls forming section 142 additionally taper to increase the velocity of air over the heatsink fins. A dual blower 144 and 145 are shown at the intake end 141 of the ducting 146 for high availability and redundant throughput of air. A flapper valve, or cutoff flap, 148 is shown for operation with a single blower. Failure of a single blower, e.g. blower 145, results in the cutoff flap 148 moving over, as shown by arrow 149 and phantom lines 148', to block escape of incoming air 136 out of either failed intake port 133 or 135. Cutoff flap 148 is stopped at an angle against the sides of the ducting to minimize eddy currents. If both blowers 144, 145 are operational, then the flap remains neutralized in the center by the force of the incoming air. Air escapes 137 from outlet port 138. Such high performance configurations have been found to produce a measured $R_{hs}=0.15°$ C./W.

Figure 10:
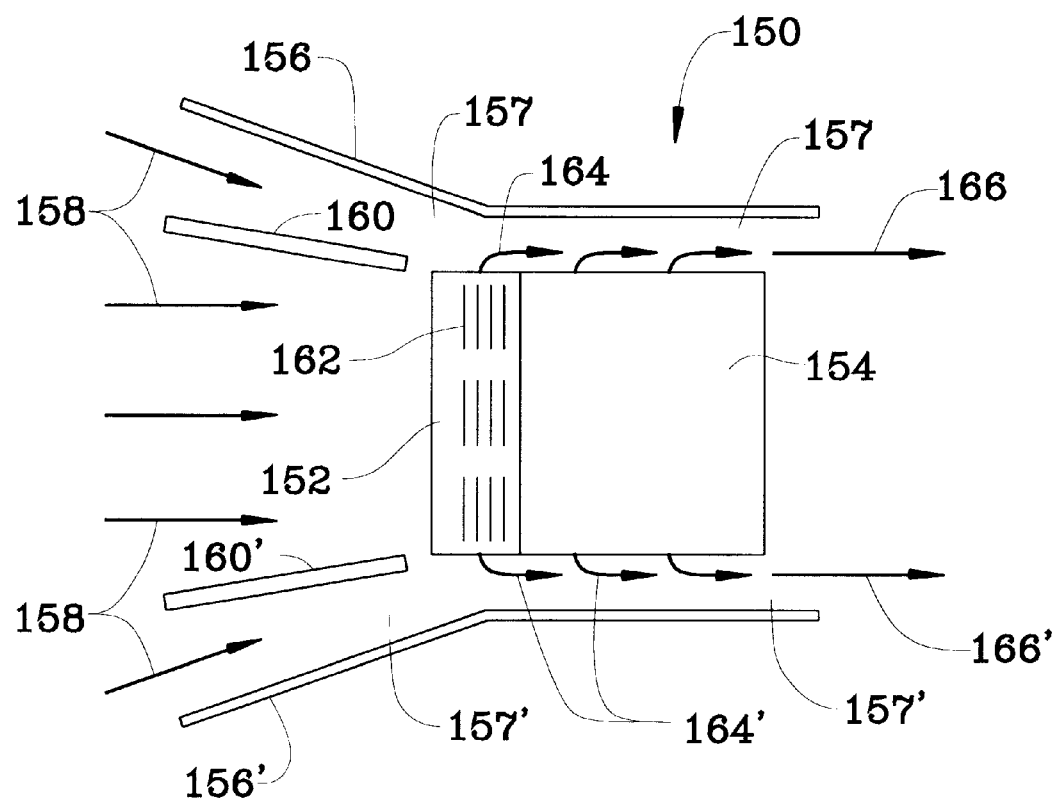
FIG. 10 shows a top view of a ducted air flow configuration for containing and cooling a skived heatsink.
Figure 11:
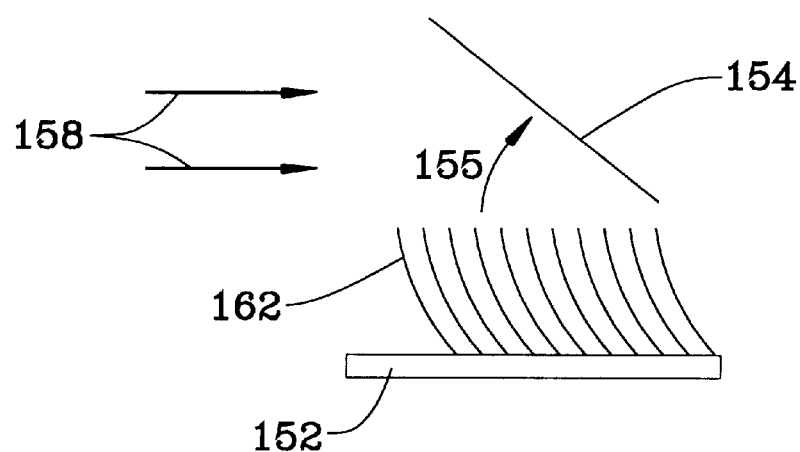
FIG. 11 shows a side view of the heatsink and partial ducting configuration of FIG. 10.

FIGS. 10 and 11 show yet another ducted configuration 150, wherein the heatsink 152 includes a scoop 154, with FIG. 10 showing a top view of the ducted configuration 150, and FIG. 11 showing a side view of the heatsink 152 and scoop 154. The scoop 154 might be angled through a variety of settings, e.g. 0–90 degrees, with 30–45 degrees being typically used. The outer ducting 156, 156' is angled at the end collecting and receiving the incident air, such air indicated generally by arrows 158. An additional inner set of ducting walls 160, 160' is shown for further directing the air 158 towards the heatsink fins 162. The outer channels 157, 157' create a low pressure region, due to the higher relative velocity of exiting air, which serves to extract air from the heatsink fins 162. The exiting air is shown by arrows 166, 166', and the extracted air is shown by arrows 164, 164' coming from the sides of the heatsink.

Figure 12:
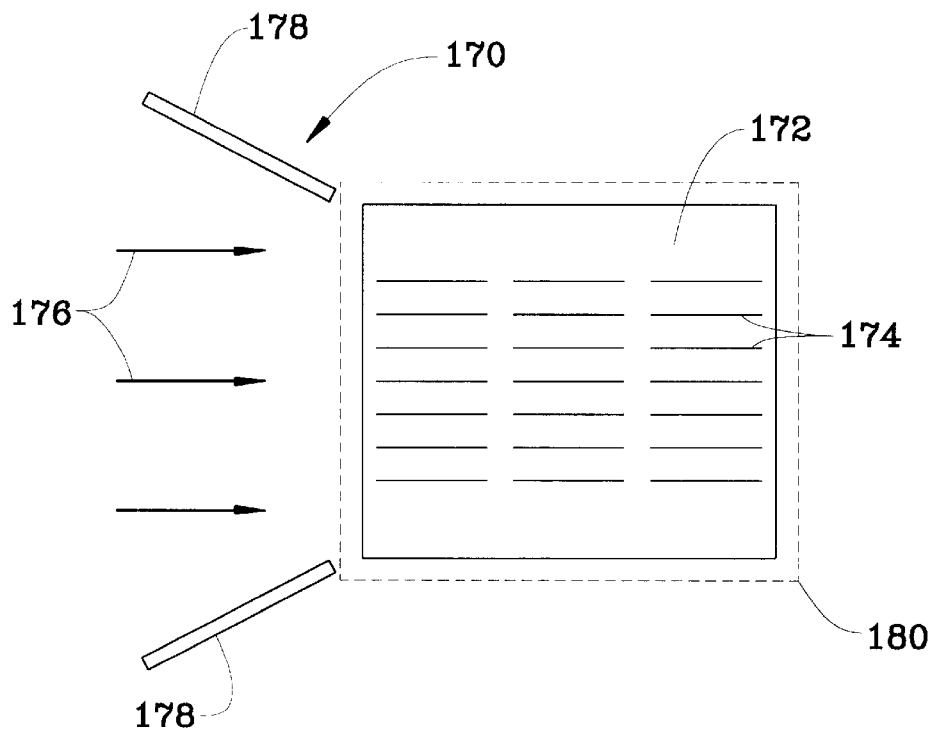
FIG. 12 shows a top view of a ducted air flow configuration for containing and cooling a skived heatsink.
Figure 13:
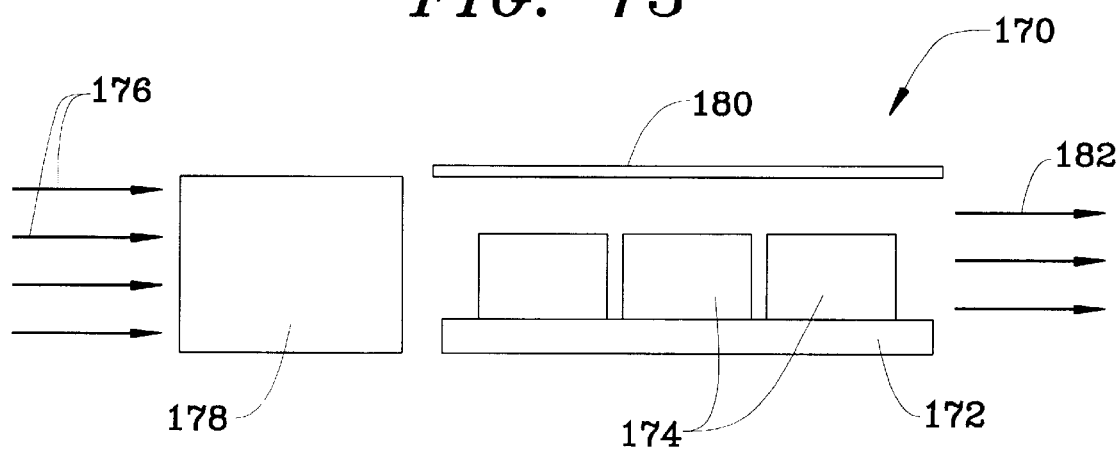
FIG. 13 shows a side view of the heatsink and ducting configuration of FIG. 12.

FIGS. 12 and 13 show still another ducted configuration 170, with FIG. 12 showing a top view and FIG. 13 showing a side view. In this instance, the heatsink 172 has the skived fins 174 oriented parallel with the incident air indicated by arrows 176. Ducting walls 178 are used to collect and channel the incident airflow 176 into the heatsink 172. An upper wall 180, which is shown in phantom in FIG. 13, further contains the exiting airflow 182 over and through the heatsink fins 174.

Figure 14:
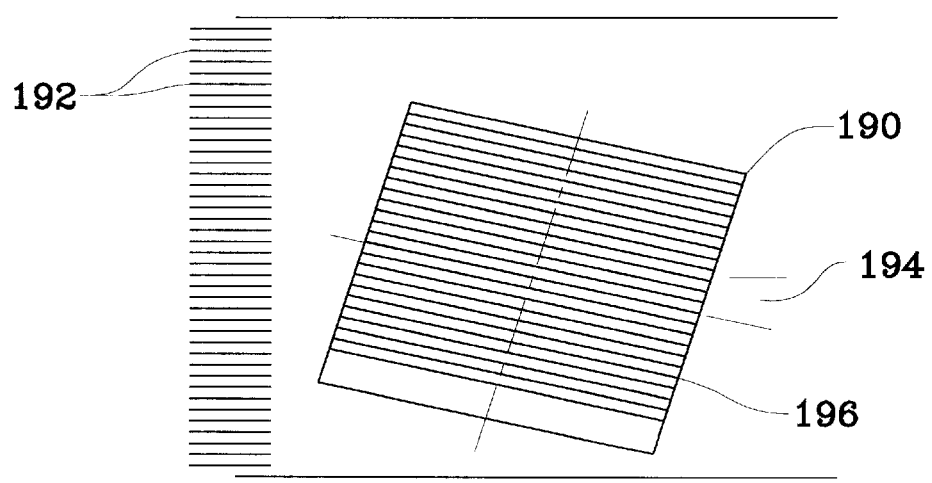
FIG. 14 shows a top view of a preferred orientation of a skived heatsink in relation to the incident airflow.
Figure 15A:
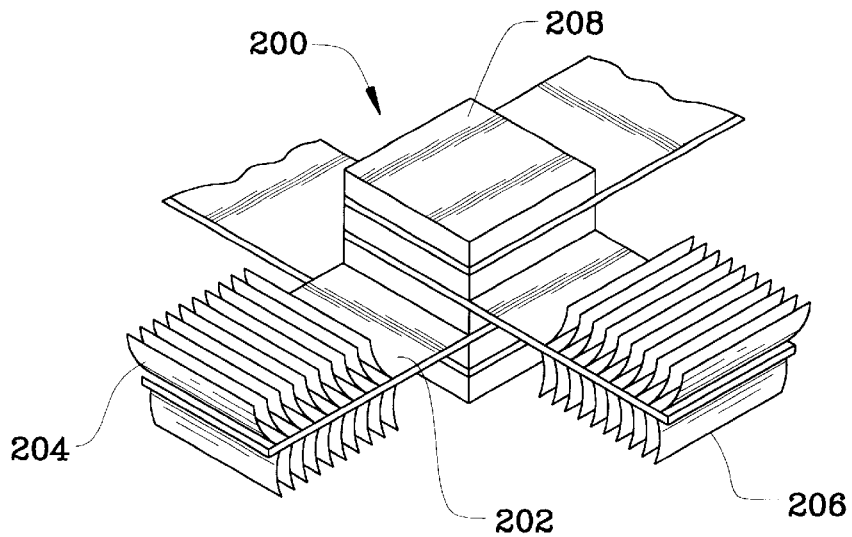
FIG. 15A shows a perspective view a stack of orthogonally mounted components and associated dual skived heatsinks.

Referring now to FIG. 14, an advantageous orientation of the heatsink 190 is shown with respect to the incident airflow shown by arrows 192. In this example, the angle of incidence of the heatsink fins 196 to the incident air 192 is 15 degrees. This orientation has been found to enhance the performance of the skived heatsink, with indicated reductions of 4° C. in heatsink maximum temperature for certain power configurations. This is due to the better "wetting" of the fins, or channeling of air through the curved fins 196, at the orientation shown. Referring now to FIG. 15A, the above mentioned heatsinks with embedded heatpipes can be employed either alone, or in a stacked fashion 200 as shown. As such, each heatpipe section 202 might accommodate a processor module, and the modules could be stacked. Alternatively a plurality of heatsinks might be used to channel heat away from a lesser number of heatsinks. In the configuration 202 shown, each skived heatsink, e.g. 204, 206, etc., accommodates a processor module 208. The four modules are stacked so that the heatsinks are orthogonally oriented, yet another number of heatsinks might be used and stacked at other angular orientations to each other.

Figure 15B:
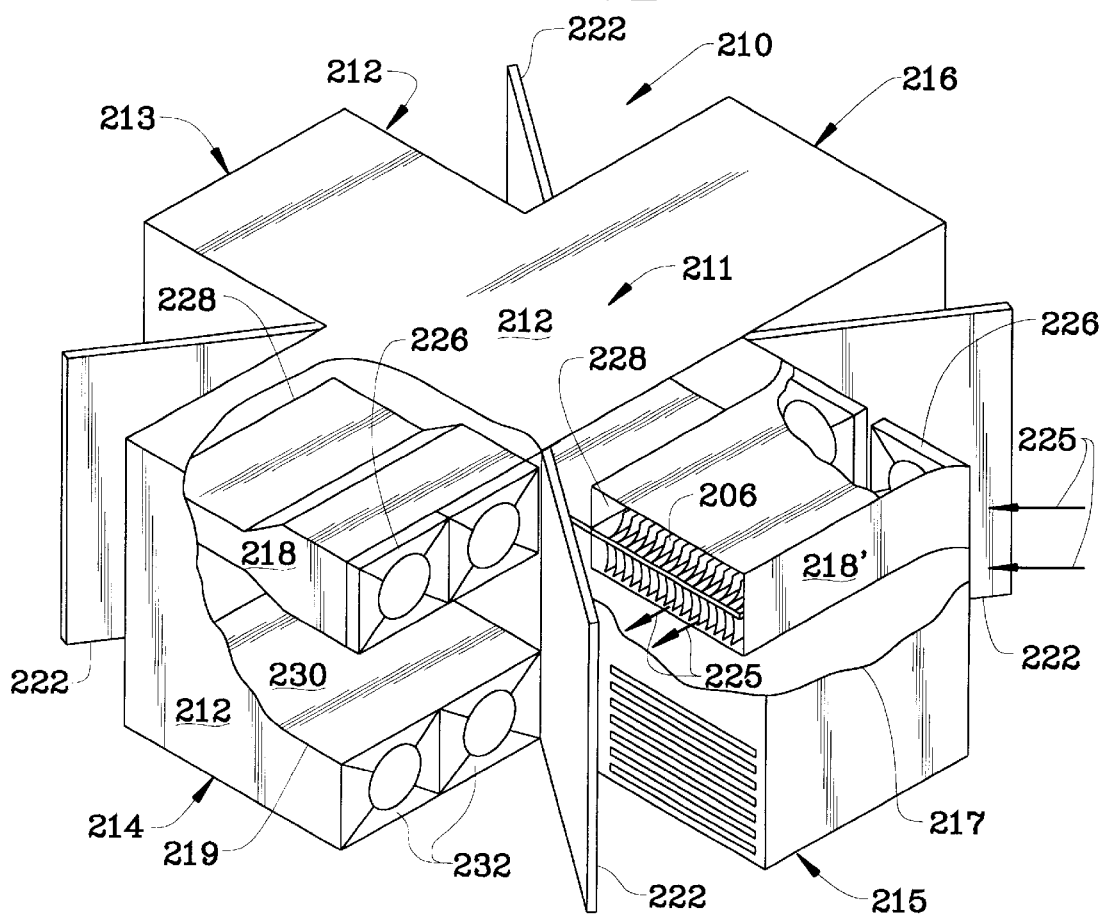
FIG. 15B shows a perspective view of the orthogonally mounted components of FIG. 16A and a ducted air flow configuration for containing and cooling the stacked components.

FIG. 15B shows an example ducting configuration 210 wherein the stacked heatsink configuration 200 is located inside walls 212. Arms 214 and 215 of the configuration 210 each show cutaway views 219 and 217. A separate inner ducting configuration 218 accommodates each of the dual skived heatsinks comprising the stacked module configuration 200. The exit port 228 of inner ducting configuration 218' oriented in the direction of arm 215 shows the dual skived heatsink 206 contained within the ducting. Each arm, e.g. 213–216, includes an intake with an angled door 222 for deflecting and receiving incident air 224. The inner ducting configuration 218, 218' includes at least one blower or fan 226 which forces air 224 over and through the fins of the dual skived heatsink, and out the exit port 228 of the ducting configuration 218, 218' as exiting air 225. The door 222 thereby also serves as an exit air deflector. Arm 214 additionally shows an example power module 230 with another set of blowers or fans 232 for cooling the power module. Hence, according to this ducting configuration 210, the stacked processor modules 208 will be oriented in the central part 211 of the ducting 212, with the radial arms 213–216 providing thermal cooling where airflow can be maximized over the skived heatsink fins.

Figure 16:
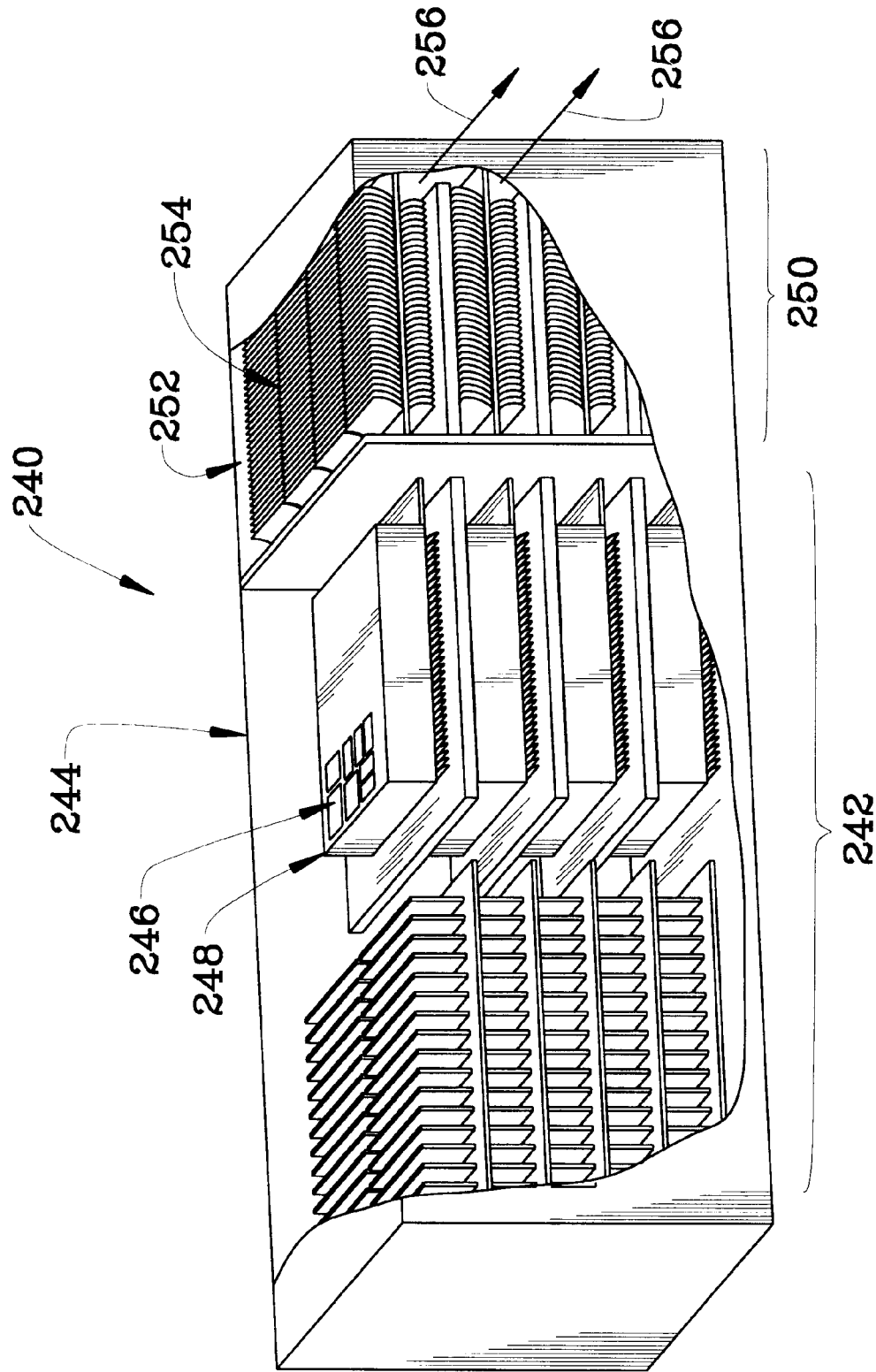
FIG. 16 shows a processor cooling assembly which applies skived heatsink assemblies in an favorable manner.

Referring now to FIG. 16, a perspective view of a partitioned cooling system 240 is shown. The system cooling partitioning is based on power density and air flow requirements for each particular application. In this example, the high density power module cooling is handled independently from the other sources. In section 242, system air is used flowing, for instance, at 1.5 to 2 m/s. Section 242 encompasses a processor module zone 244 which might include, among other things, microprocessor modules 246 and DC—DC converters 248. Section 250 encompasses a processor cooling zone 252 which includes, for instance, double sided skived heatsinks 254 which are thermally connected via heatpipes to the processors. Accordingly, the heat from the processors 246 are transferred to a separate cooling zone independent from other components. The high aspect ratio, double sided skived heatsinks provide the targeted thermal resistance. The processor cooling zone 250 is serviced by specially selected air blowers that are tuned for the processor module heatsink, and uses the above mentioned appropriate ducting. Typically, "N+1" blowers are used for high availability of circulated air, where N is the number of blowers, and the ducted air exits the processor cooling zone as shown by arrows 256.

With this arrangement, non-microprocessor sources of power are cooled through application of low-cost personal computer (PC) system fans with high volumetric flow at low static pressure. Components cooled by such methods include, for instance, power supply components with low aspect ratio extruded heat sinks, low power I/O cards, and node routing components. Processor components which typically generate more heat, however, can be cooled with high aspect ratio skived heatsinks with embedded heatpipes and appropriate ducting.

The partitioning of the thermal cooling requirements has a cost advantage, as the design of air flow through the most resistive component in a system, e.g. the processor module heat sink, is decoupled from the other sources of power. Using only a conventional fan bank to service the entire system, including the microprocessor module stack, makes it difficult to match the air flow resistance through the various paths. Moreover, the partitioned approach allows the system to use a variety components which might require different thermal technology approaches to cool them, ranging from low power components to high power microprocessors.

It is to be understood that while certain forms of the invention are illustrated, it is not to be limited to the specific forms or arrangement of parts herein described and shown.

The advantageous use of skived heatsinks in conjunction with embedded and expanded heatpipes are intended to be used with any ducting configuration, and not just those illustrated. Accordingly, it will be apparent to those skilled in the art that various changes may be made without departing from the scope of the invention and the invention is not to be considered limited to what is shown in the drawings and descriptions.

What is claimed is:

1. A high aspect ratio heatsink system for use with a heat-producing electrical component, the system comprising:
 a skived heatsink including:
  a longitudinally extending base with first and second sides having a first and a second plurality of skived fins, respectively, extending outwardly and perpendicularly to said base on fin segments thereof, wherein said plurality of skived fins provide a low thermal resistance with said base;
  said base having a contact segment capable of contacting the heat-producing electrical component and conducting heat therefrom into said base;
 at least one longitudinally extending heatpipe disposed between said first and second pluralities of skived fins and extending from said contact segment to said fin segments, said heatpipe in heat conductive contact with said base to augment heat conduction between said contact segment and said fin segments; and
 at least one receiving means for said heatpipe formed in said base having said heatpipe disposed therein.

2. The high aspect ratio heatsink system as claimed in claim 1, wherein said base includes a longitudinally extending section which forms a portion of said receiving means to encompass said heatpipe along the longitudinal extension thereof.

3. The high aspect ratio heatsink system as claimed in claim 1, wherein said base includes at least one longitudinally extending extruded hole formed therein as said receiving means for said heatpipe.

4. The high aspect ratio heatsink system as claimed in claim 1, wherein a thermally enhanced compound is used between said heatpipe and said base, and said heatpipe is expanded to fill said receiving means, whereby a lower interface thermal resistance is produced and gaps filled between said heatpipe and said base.

5. The high aspect ratio heatsink system as claimed in claim 4, wherein said heatpipe is expanded with a pressurized fluid before filling said heatpipe with a working fluid.

6. The high aspect ratio heatsink system as claimed in claim 4, wherein said heatpipe is sealed with a working fluid and expanded via internal pressure caused by heating said heatpipe.

* * * * *